(12) United States Patent
Hirabayashi et al.

(10) Patent No.: US 9,437,720 B2
(45) Date of Patent: Sep. 6, 2016

(54) SEMICONDUCTOR DEVICE

(71) Applicant: Toyota Jidosha Kabushiki Kaisha, Toyota-shi Achi-ken (JP)

(72) Inventors: Yasuhiro Hirabayashi, Toyota (JP); Masaru Senoo, Okazaki (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 0 days.

(21) Appl. No.: 14/942,528

(22) Filed: Nov. 16, 2015

(65) Prior Publication Data
US 2016/0141401 A1 May 19, 2016

(30) Foreign Application Priority Data

Nov. 17, 2014 (JP) .................................. 2014-232836

(51) Int. Cl.
*H01L 29/739* (2006.01)
*H01L 29/10* (2006.01)
*H01L 29/06* (2006.01)
*H01L 29/732* (2006.01)

(52) U.S. Cl.
CPC ....... *H01L 29/7397* (2013.01); *H01L 29/0696* (2013.01); *H01L 29/1095* (2013.01)

(58) Field of Classification Search
CPC .......... H01L 29/0696; H01L 29/1095; H01L 29/66325–29/66348; H01L 29/7393–29/7397
See application file for complete search history.

(56) References Cited

U.S. PATENT DOCUMENTS

| | | | | |
|---|---|---|---|---|
| 5,828,100 A * | 10/1998 | Tamba | ................ | H01L 29/7397 257/328 |
| 6,049,108 A * | 4/2000 | Williams | ............ | H01L 27/0255 257/155 |
| 6,060,747 A * | 5/2000 | Okumura | ............ | H01L 29/0696 257/331 |
| 6,566,691 B1 * | 5/2003 | Inoue | .................. | H01L 29/7397 257/133 |
| 6,774,408 B2 * | 8/2004 | Ninomiya | ......... | H01L 21/82348 257/136 |
| 6,777,783 B2 * | 8/2004 | Matsuda | ............. | H01L 29/0696 257/329 |
| 7,598,566 B2 * | 10/2009 | Hotta | .................. | H01L 29/0696 257/327 |
| 8,178,947 B2 * | 5/2012 | Takahashi | ........... | H01L 29/7397 257/133 |
| 8,334,565 B2 * | 12/2012 | Yoshikawa | ......... | H01L 29/7397 257/330 |
| 8,384,151 B2 * | 2/2013 | Pfirsch | ................ | H01L 29/0834 257/328 |
| 9,082,813 B2 * | 7/2015 | Pfirsch | ................ | H01L 29/0834 |
| 9,337,270 B2 * | 5/2016 | Pfirsch | ................ | H01L 29/7397 |
| 2003/0116807 A1 * | 6/2003 | Matsuda | ............. | H01L 29/0696 257/370 |

(Continued)

FOREIGN PATENT DOCUMENTS

JP          2013-150000 A     8/2013

*Primary Examiner* — William F Kraig
*Assistant Examiner* — Maliheh Malek
(74) *Attorney, Agent, or Firm* — Dinsmore & Shohl LLP

(57) ABSTRACT

A semiconductor device has emitter regions disposed in at least one cell region in a first inter-trench region, not disposed in a middle inter-trench region, and disposed in at least one cell region in the second inter-trench region. Each of the emitter regions is disposed at a position that is not in contact with first trenches but is in contact with two second trenches defining the corresponding cell region.

4 Claims, 9 Drawing Sheets

(56) References Cited

U.S. PATENT DOCUMENTS

| | | | |
|---|---|---|---|
| 2004/0178441 A1* | 9/2004 | Yanagisawa | H01L 29/1095 257/327 |
| 2004/0195618 A1* | 10/2004 | Saito | H01L 29/0634 257/330 |
| 2007/0040213 A1* | 2/2007 | Hotta | H01L 29/0696 257/330 |
| 2008/0315301 A1* | 12/2008 | Takemori | H01L 29/1095 257/331 |
| 2009/0014754 A1* | 1/2009 | Yoshikawa | H01L 29/7397 257/139 |
| 2010/0301410 A1* | 12/2010 | Hirler | H01L 29/7813 257/334 |
| 2011/0101416 A1* | 5/2011 | Schulze | H01L 29/0834 257/139 |
| 2012/0043606 A1* | 2/2012 | Sato | H01L 29/0623 257/334 |
| 2013/0056790 A1* | 3/2013 | Kawamura | H01L 29/402 257/139 |
| 2014/0084332 A1* | 3/2014 | Lee | H01L 29/7397 257/139 |
| 2014/0339602 A1* | 11/2014 | Higuchi | H01L 29/4236 257/141 |
| 2015/0144989 A1* | 5/2015 | Seo | H01L 29/66348 257/139 |
| 2015/0144990 A1* | 5/2015 | Park | H01L 29/66325 257/139 |
| 2015/0187919 A1* | 7/2015 | Song | H01L 29/0696 257/139 |
| 2015/0187920 A1* | 7/2015 | Park | H01L 29/7397 257/139 |
| 2015/0200247 A1* | 7/2015 | Schmidt | H01L 29/66348 257/140 |
| 2015/0206960 A1* | 7/2015 | Hirabayashi | H01L 27/0727 257/140 |
| 2015/0228736 A1* | 8/2015 | Sakakibara | H01L 29/4236 257/330 |
| 2015/0279953 A1* | 10/2015 | Machida | H01L 29/456 257/330 |
| 2016/0071841 A1* | 3/2016 | Saito | H01L 27/0716 257/140 |
| 2016/0111529 A1* | 4/2016 | Hirabayashi | H01L 29/1095 257/139 |
| 2016/0172453 A1* | 6/2016 | Hirabayashi | H01L 29/41708 257/144 |
| 2016/0172471 A1* | 6/2016 | Hirabayashi | H01L 29/7397 257/124 |

* cited by examiner ns_US_9437720_B2_001

SEMICONDUCTOR DEVICE

CROSS-REFERENCE TO RELATED APPLICATION

This application claims priority to Japanese Patent Application No. 2014-232836 filed on Nov. 17, 2014, the contents of which are hereby incorporated by reference into the present application.

TECHNICAL FIELD

The present application relates to a semiconductor device.

DESCRIPTION OF RELATED ART

Japanese Patent Application Publication No. 2013-150000 discloses a semiconductor device fabricated in a semiconductor substrate. The semiconductor device is a vertical IGBT. The semiconductor device includes: a p-type body region disposed at one portion of the semiconductor substrate in a cross sectional view of the semiconductor substrate; an n-type drift region disposed below the body region in the cross sectional view; and n-type emitter regions separated from the drift region by the body region and exposed on an upper surface of the semiconductor substrate. The semiconductor device further includes: a trench extending from the upper surface of the semiconductor substrate, piercing the body region and reaching the drift region in the cross sectional view; a gate insulation film disposed on an inner surface of the trench; and a gate electrode disposed in the trench.

FIG. 1 of Japanese Patent Application Publication No. 2013-150000 shows an embodiment in which, in a plan view of the semiconductor substrate, trenches extending in a longitudinal direction and trenches extending in a transverse direction are used in combination. A trench shape used in the above embodiment causes a rise in hole density inside a bent part at which a trench extending in the longitudinal direction and a trench extending in the transverse direction cross each other, thus resulting in a reduced on-resistance of the IGBT.

The IGBT of Japanese Patent Application Publication No. 2013-150000 mainly aims to reduce the on-resistance and, as such, fails to take sufficient measures against a phenomenon in which an excessive number of electrons flows from the emitter regions into the drift region and the semiconductor device breaks down. The present disclosure provides a technology for improving a breakdown resistance of a semiconductor device by suppressing the number of electrons flowing in from emitter regions.

If a region in which the emitter regions are disposed in the plan view of the semiconductor substrate is small, the number of electrons flowing from the emitter regions can be suppressed. FIG. 12 of Japanese Patent Application Publication No. 2013-150000 shows an embodiment in which, in case of denoting for example each of regions between two adjacent trenches extending in the longitudinal direction as a first inter-trench region, a second inter-trench region, and a third inter-trench region, in sequence from the left, a plurality of inter-trench regions arranged along the transverse direction is alternately used as cell regions. That is, in the embodiment thus disclosed, cell structures are disposed in the first inter-trench region and the third inter-trench region, and no cell structures are disposed in the second inter-trench region and a fourth inter-trench region. This reduces the region in which the emitter regions are disposed in the plan view of the semiconductor substrate, thus making it possible to suppress the number of electrons flowing from the emitter regions.

However, depending on the position where the narrowly-confined emitter regions are disposed, electrons can undesirably concentrate on a local region, thus causing a reduction in the breakdown resistance of the semiconductor device.

BRIEF SUMMARY

The present disclosure provides a technology for improving the breakdown resistance of a semiconductor device not only by suppressing the total number of electrons flowing from emitter regions but also by preventing electrons from concentrating on a local region.

One aspect of the present disclosure provides a semiconductor device. The semiconductor device has a semiconductor substrate in which a semiconductor element is disposed. The semiconductor device includes a p-type body region disposed at one portion of the semiconductor substrate in a cross sectional view of the semiconductor substrate; an n-type drift region disposed below the p-type body region in the cross sectional view; and a plurality of n-type emitter regions separated from the n-type drift region by the p-type body region and exposed on an upper surface of the semiconductor substrate. The semiconductor device includes a trench extending from the upper surface of the semiconductor substrate, piercing the p-type body region and reaching the n-type drift region in the cross sectional view, wherein the trench includes, in a plan view of the semiconductor substrate, a plurality of first trenches extending in a first direction and arranged at intervals in a second direction intersecting the first direction, and a plurality of second trenches extending in the second direction and arranged at intervals in the first direction. The semiconductor device includes a gate insulation film disposed on an inner surface of the trench; and a gate electrode disposed in the trench. The semiconductor device includes a plurality of inter-trench regions, each of the plurality of inter-trench regions being a region between two first adjacent trenches; and a plurality of cell regions, each of the plurality of cell regions being a region defined by two adjacent first trenches and two adjacent second trenches. The plurality of inter-trench regions includes a first inter-trench region; a second inter-trench region separated from the first inter-trench region by at least one of the inter-trench regions being interposed in between in the second direction; and a middle inter-trench region interposed in between the first inter-trench region and the second inter-trench region. The emitter regions are disposed in at least one cell region in the first inter-trench region, are not disposed in the middle inter-trench region, and are disposed in at least one cell region in the second inter-trench region. Each of the emitter regions is disposed at a position that is not in contact with the first trenches but is in contact with the two second trenches defining the corresponding cell region.

Such a configuration makes it possible to reduce the number of n-type emitter regions in the second direction in which the inter-trench regions align. That is, when the emitter regions are disposed in all of the plurality of inter-trench regions, the number of emitter regions is large. On the other hand, in the configuration described above, the emitter regions are not disposed in the middle inter-trench region interposed between the first inter-trench region and the second inter-trench region. This makes it possible to reduce the number of emitter regions. This reduces the number of emitter regions in the semiconductor substrate, thus making it possible to suppress the number of electrons flowing from the emitter regions into the drift region. Further, in the configuration described above, the emitter regions are disposed in such a manner as not to be in contact with the first trenches. This makes it possible to further suppress the number of electrons flowing from the emitter regions into the drift region as compared with a case where the emitter regions are in contact with both the first trenches and the second trenches. Further, in the configuration described above, each of the cell regions includes the emitter regions that are in contact with the two second trenches. This allows the emitter regions to be disposed in a balanced manner. This allows electrons to flow from the emitter regions into the semiconductor substrate in a balanced manner in the corresponding cell region. As a result, this evens out the number of electrons flowing in, thus making it possible to suppress concentration of currents. By thus being able to suppress the number of electrons flowing into the drift region and to suppress the concentration of currents, the breakdown resistance of the semiconductor device can be increased.

Further, in the configuration described above, the emitter regions are in contact with the second trenches. This makes it possible to reduce the on-resistance of the semiconductor device by a hole accumulation effect. That is, in the configuration described above, the emitter regions are not disposed in the middle inter-trench region interposed between the first inter-trench region and the second inter-trench region. For this reason, if the emitter regions in the first inter-trench region and the second inter-trench region are in contact with the first trenches, holes present in a portion of the drift region located in the middle inter-trench region flow away from the first trenches. This results in a reduction of the hole accumulation effect in the middle inter-trench region. On the other hand, in the configuration described above, the emitter regions in the first inter-trench region and the second inter-trench region are in contact with the second trenches but are not in contact with the first trenches. This prevents the holes in the middle inter-trench region from flowing away from the first trenches, thus making it possible to bring about a high hole accumulation effect.

DETAILED DESCRIPTION (First Embodiment)

Figure 1:
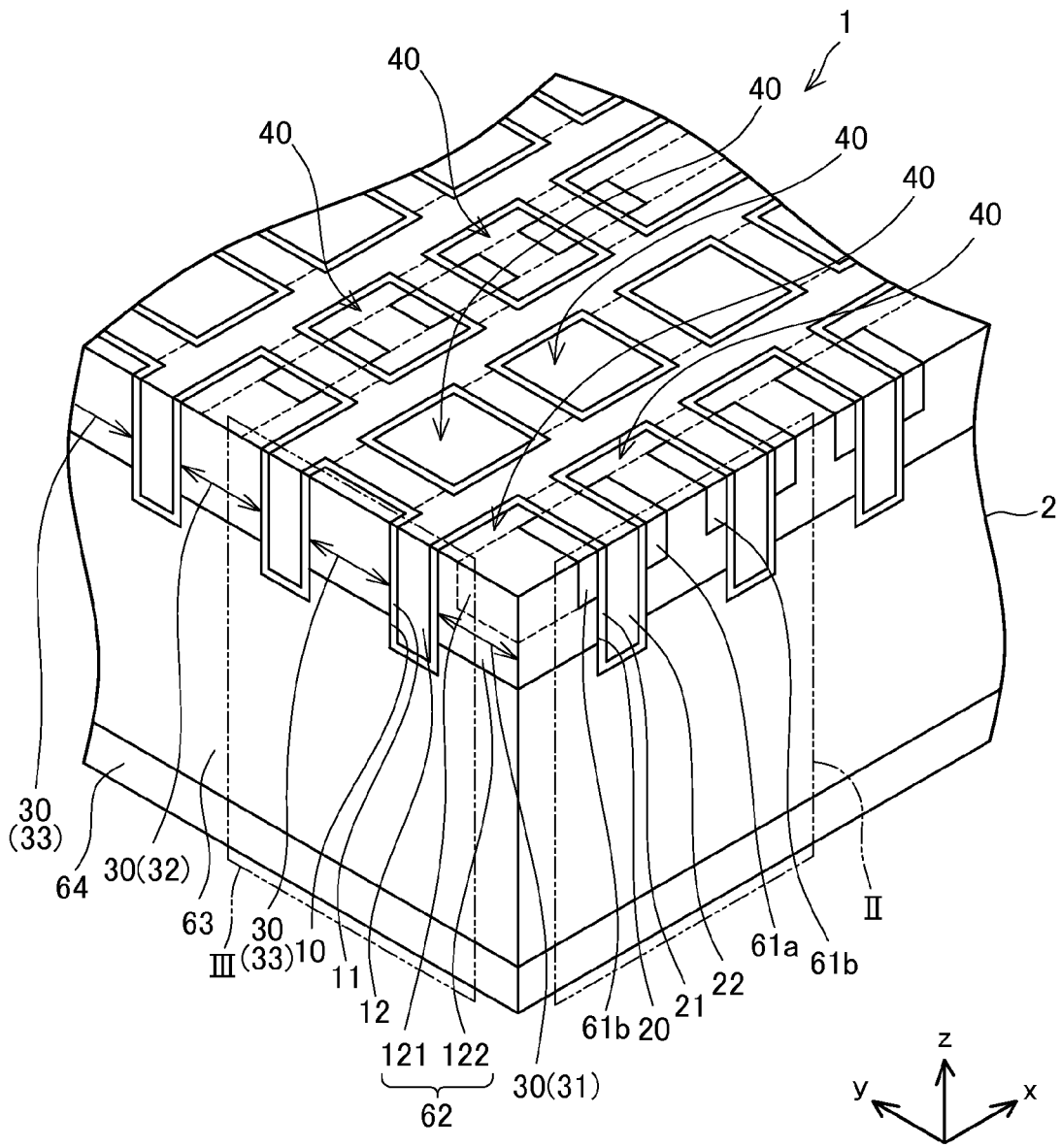
FIG. 1 is a perspective view of a semiconductor device.
Figure 2:
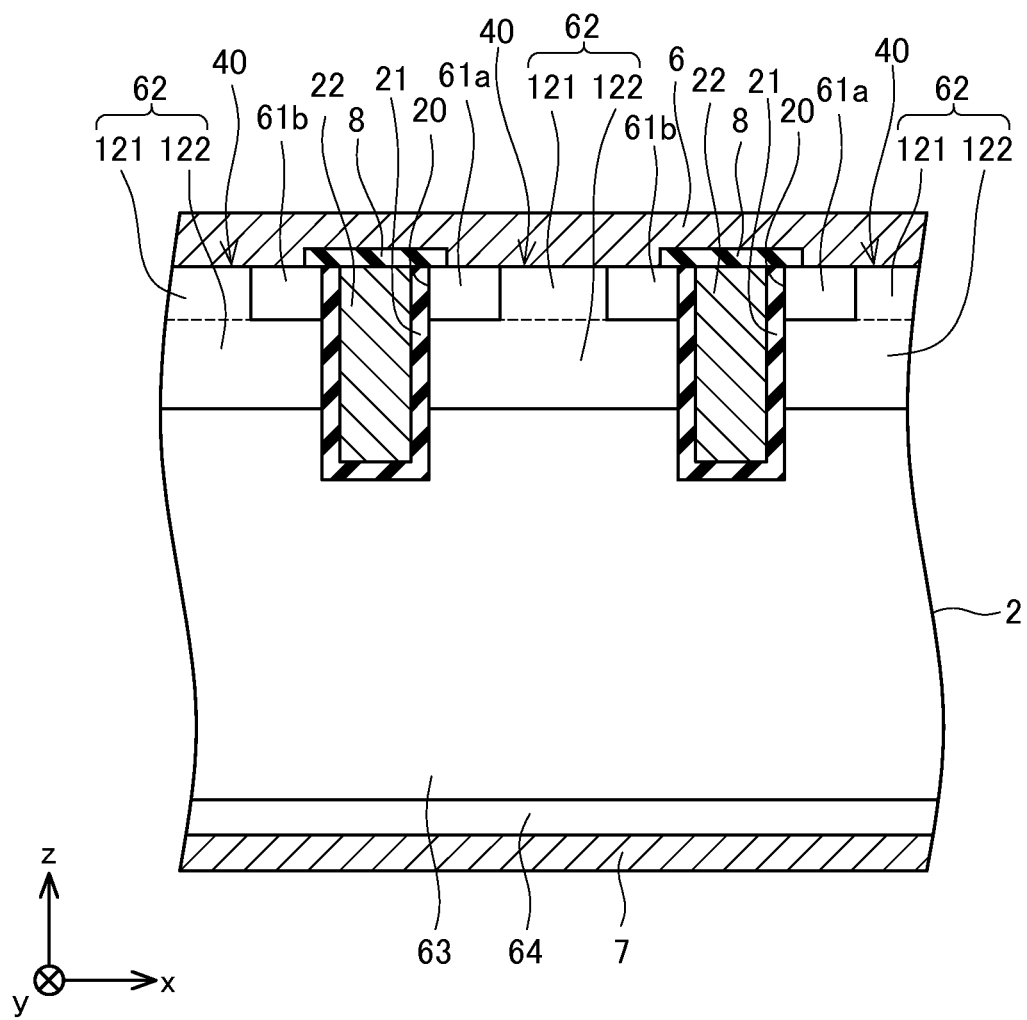
FIG. 2 is an enlarged view of a main part II of FIG. 1.
Figure 3:
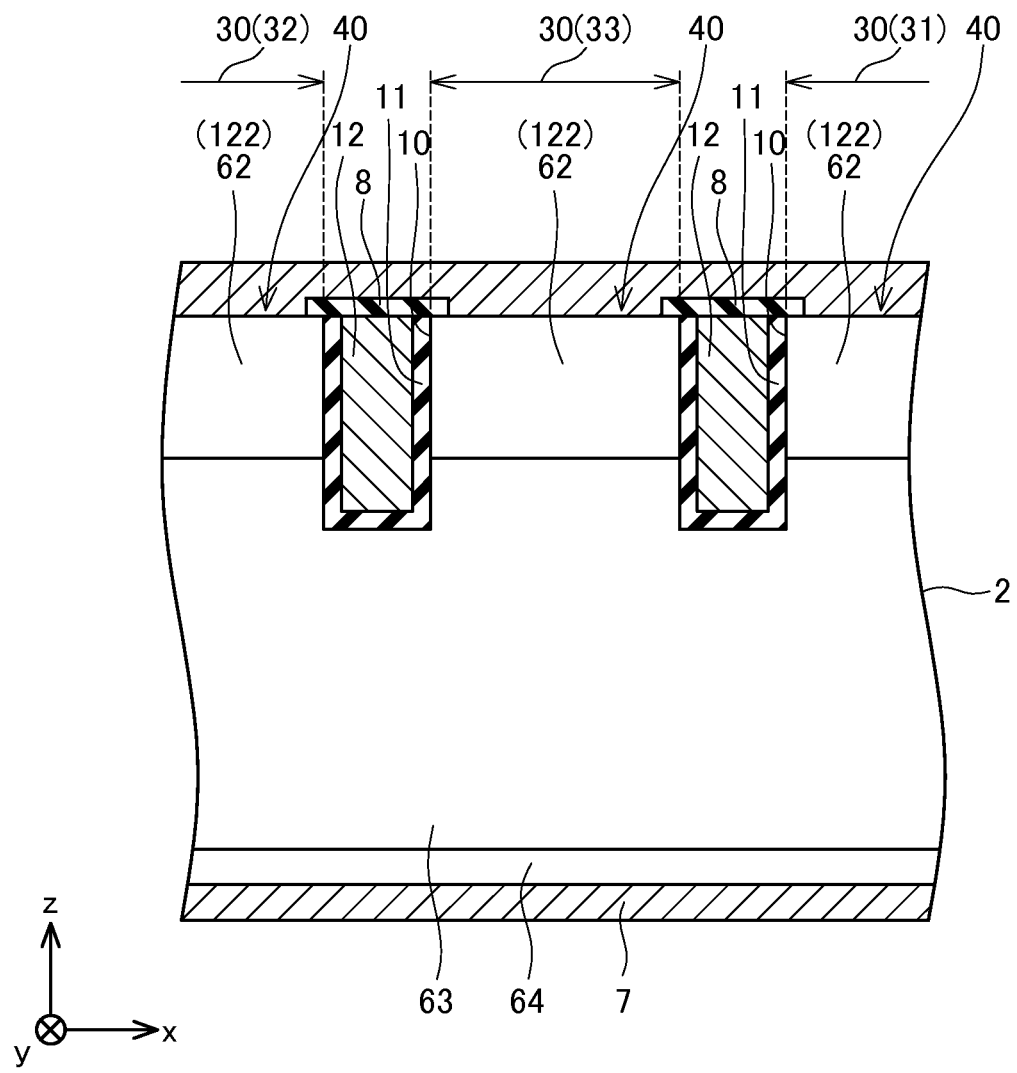
FIG. 3 is an enlarged view of a main part III of FIG. 1.

An embodiment will be described below with reference to the accompanying drawings. As shown in FIGS. 1 to 3, a semiconductor device 1 according to a first embodiment includes a semiconductor substrate 2, a front surface electrode 6, and a back surface electrode 7 (Note that, for the sake of viewability of the drawing, FIG. 1 omits to show the front surface electrode 6 and the back surface electrode 7.).

The semiconductor substrate 2 is made of silicon carbide (SiC). In another embodiment, the semiconductor substrate 2 may be made of silicon (Si), gallium nitride (GaN), or the like. A semiconductor element is disposed in the semiconductor substrate 2. The present embodiment takes an IGBT (insulated gate bipolar transistor) as an example of the semiconductor element.

The front surface electrode 6 and the back surface electrode 7 are made of a conductive metal such as aluminum (Al), copper (Cu), or the like. The front surface electrode 6 is disposed on a front surface of the semiconductor substrate 2. The back surface electrode 7 is disposed on a back surface of the semiconductor substrate 2. The front surface electrode 6 and the back surface electrode 7 are each connected to a power supply (not illustrated).

A trench (a plurality of first trenches 10 and a plurality of second trenches 20) is disposed in the semiconductor substrate 2. Further, in the semiconductor substrate 2, emitter regions 61, body regions 62 (body contact regions 121, low density body regions 122), a drift region 63, and a collector region 64 are disposed in this order from an upper surface side.

The trench includes the plurality of first trenches 10 and the plurality of second trenches 20. The trench (the plurality of first trenches 10 and the plurality of second trenches 20) extends in a depth direction from an upper surface of the semiconductor substrate 2 through the body regions 62 to a position to reach the drift region 63 in a cross sectional view of the semiconductor substrate 2.

A first gate insulation film 11 is disposed on an inner surface of each of the first trenches 10. A usable example of the first gate insulation filmd 11 may be a silicon dioxide film ($SiO_2$). A first gate electrode 12 is disposed inside each of the first trenches 10. The first gate electrodes 12 fill the first trenches 10 on an inner side of the first gate insulation films 11. The first gate electrodes 12 are made, for example, of aluminum or polysilicon. An interlayer insulation film 8 is disposed above the first gate electrodes 12. The interlayer insulation film 8 insulates the front surface electrode 6 and the first gate electrodes 12 from each other.

A second gate insulation film 21 is disposed on an inner surface of each of the second trenches 20. A usable example of the second gate insulation films 21 may be a silicon dioxide film ($SiO_2$). The second gate insulation films 21 are joined to the first gate insulating films 11. A second gate electrode 22 is disposed inside each of the second trenches 20. The second gate electrodes 22 fill of the second trenches 20 on an inner side than the second gate insulating films 21. The second gate electrodes 22 are made, for example, of aluminum or polysilicon. The interlayer insulation film 8 is disposed above the second gate electrodes 22. The interlayer insulation film 8 insulates the front surface electrode 6 and the second gate electrodes 22 from each other.

The first gate electrodes 12 and the second gate electrodes 22 are joined to each other and function as a single gate electrode. The first gate electrodes 12 and the second gate electrodes 22 are insulated from the semiconductor substrate 2 by the first gate insulation films 11 and the second gate insulation films 21, respectively. The first gate electrodes 12 and the second gate electrodes 22 are connected to a gate potential control circuit (not illustrated).

The emitter regions 61 are n-type regions. The emitter regions 61 are high in n-type impurity density. The emitter regions 61 are disposed in a form of islands in ranges exposed on the upper surface of the semiconductor substrate 2. The emitter regions 61 are separated from the drift region 63 by the body regions 62. The emitter regions 61 are in contact with the second gate insulation films 21. The emitter regions 61 are in contact with the front surface electrode 6. The emitter regions 61 are in ohmic contact with the front surface electrode 6 and have electrical continuity with the front surface electrode 6.

The body regions 62 are p-type regions. Each of the body regions 62 is disposed around the corresponding emitter regions 61. The body region 62 is disposed on lateral sides of and below the emitter regions 61. Further, in inter-trench regions 30 in which the emitter regions 61 are not disposed, the body regions 62 are disposed in a whole range exposed on the upper surface of the semiconductor substrate 2. Each of the body regions 62 includes the body contact region 121 and the low density body region 122.

The body contact region 121 is high in p-type impurity density. The body contact region 121 is disposed in a range exposed on the upper surface of the semiconductor substrate 2. The body contact region 121 is in contact with the front surface electrode 6. The body contact region 121 is in ohmic contact with the front surface electrode 6 and has electrical continuity with the front surface electrode 6.

A p-type impurity density of the low density body region 122 is lower than that of the body contact region 121. The low density body region 122 is disposed below the emitter regions 61 and the body contact region 121. The low density body region 122 is in contact with the first gate insulation films 11 and the second gate insulation films 21.

The drift region 63 is an n-type region. The drift region 63 is low in n-type impurity density. The drift region 63 is disposed below the body region 62. The drift region 63 is in contact with the first gate insulation films 11 and the second gate insulation films 21.

The collector region 64 is a p-type region. The collector region 64 is high in impurity density. The collector region 64 is disposed below the drift region 63. The collector region 64 is disposed in a range exposed on a lower surface of the semiconductor substrate 2. The collector region 64 is in contact with the back surface electrode 7. The collector region 64 is in ohmic contact with the back surface electrode 7 and has electrical continuity with the back surface electrode 7.

Figure 4:
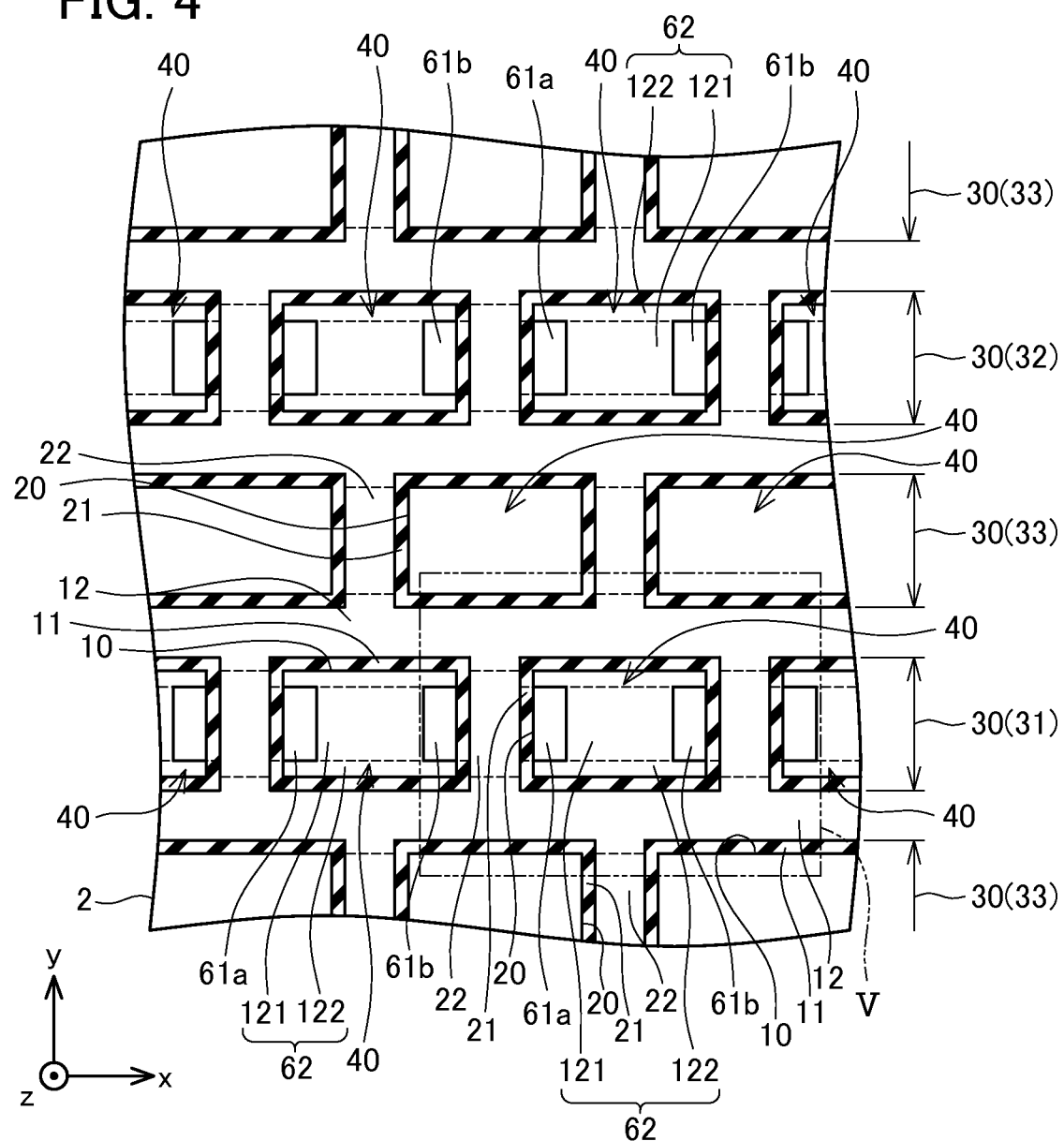
FIG. 4 is a plan view of the semiconductor device.

As shown in FIG. 4, in the plan view of the semiconductor substrate 2, the first trenches 10 extend linearly along an x direction (which is an example of the first direction). The plurality of first trenches 10 are arranged at intervals along a y direction (which is an example of the second direction). The x direction (which is an example of the first direction) and the y direction (which is an example of the second direction) are orthogonal to each other.

Each region between two first trenches 10 adjacent in the second direction is denoted as an inter-trench region 30. A plurality of the inter-trench regions 30 is disposed in the semiconductor substrate 2. The plurality of the inter-trench regions 30 is arranged along the second direction.

The plurality of the inter-trench regions 30 includes first inter-trench regions 31 and second inter-trench regions 32. Further, the plurality of the inter-trench regions 30 further includes middle inter-trench regions 33 interposed in between the corresponding first inter-trench region 31 and the corresponding second inter-trench region 32. In the present embodiment, a single middle inter-trench region 33 is disposed in between the corresponding first inter-trench region 31 and the corresponding second inter-trench region 32. The second inter-trench region 32 is apart from the first inter-trench region 31 in the second direction with the single middle inter-trench region 33 interposed in between the first inter-trench region 31 and the second inter-trench region 32.

In the plan view of the semiconductor substrate 2, the second trenches 20 extend linearly along the y direction. The plurality of the second trenches 20 is disposed in the corresponding inter-trench regions 30. The plurality of the respective second trenches 20 is respectively disposed in the first inter-trench regions 31, the second inter-trench regions 32, and the middle inter-trench regions 33. In the inter-trench regions 30, the plurality of the second trenches 20 is arranged at intervals along the x direction. Each of the second trenches 20 is connected to two first trenches 10 adjacent in the second direction. Both ends of each of the second trenches 20 in the second direction are connected to corresponding first trenches 10, respectively.

In each of the inter-trench regions 30, cell regions 40 are disposed. Each of the cell regions 40 is defined by first trenches 10 and second trenches 20. The cell regions 40 are respectively disposed in each of the first inter-trench regions 31, the second inter-trench regions 32, and the middle inter-trench regions 33. Each of the cell regions 40 is surrounded by two first trenches 10 adjacent each other in the second direction and two second trenches 20 adjacent each other in the first direction. The plurality of cell regions 40 is disposed in the semiconductor substrate 2.

The emitter regions 61 are formed in a pair in each of the cell regions 40 in the first inter-trench region 31 and the second inter-trench region 32. Meanwhile, the emitter regions 61 are not arranged in any of the cell regions 40 in the middle inter-trench region 33.

Figure 5:
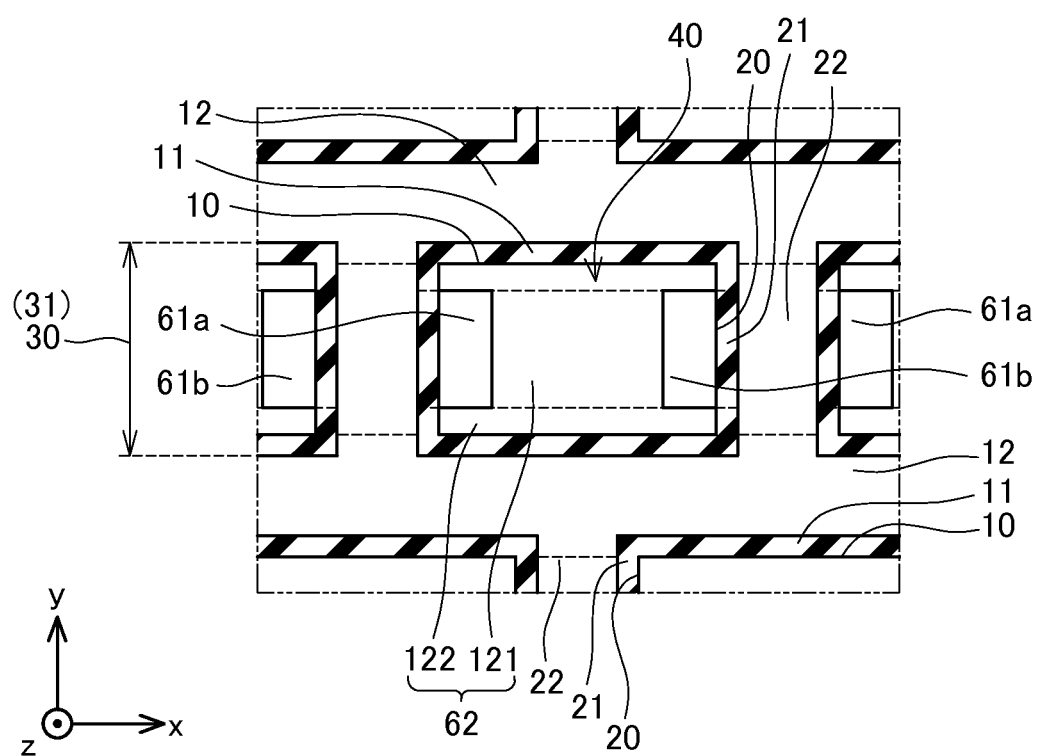
FIG. 5 is an enlarged view of a main part V of FIG. 4.

As an example, an emitter region 61a and an emitter region 61b disposed in a same cell region 40 herein forms the pair. As shown in FIG. 5, the emitter regions 61a, 61b formed in the pair in each of the cell regions 40 are disposed to face each other in the first direction. The pair of the emitter regions 61a, 61b is aligned in the first direction. The emitter regions 61a, 61b are disposed at positions that are in contact with the corresponding second trenches 20. Specifically, one of the pair of the emitter regions 61a, 61b, namely the emitter region 61a, is in contact with one of the two second trenches 20 defining the corresponding cell region 40. The other of the pair of the emitter regions 61a, 61b, namely the emitter region 61b, is in contact with the other of the two second trenches 20 defining the corresponding cell region 40. Further, the emitter regions 61 are in contact with both sides of each of the second trenches 20 in the first direction. Meanwhile, none of the emitter regions 61 are in contact with the two first trenches 10 defining the corresponding cell region 40.

For use of the semiconductor device 1 thus configured, a potential applied to the first gate electrodes 12 and the second gate electrodes 22 is set to an on-potential. This causes a channel to be formed in a range of the low density body region 122 that is in contact with the first gate insulation films 11 and the second gate insulation films 21. Further, such a voltage that a back surface side becomes positive is applied between the front surface electrode 6 and the back surface electrode 7. This causes the IGBT to be turned on. Once the IGBT is turned on, electrons flow from the front surface electrode 6 to the back surface electrode 7 through the emitter regions 61, the channel formed in the low density body region 122, the drift region 63, and the collector region 64. Further, holes flow from the back surface electrode 7 to the front surface electrode 6 through the collector region 64, the drift region 63, the low density body region 122, and the body contact region 121.

In the semiconductor device 1 according to the first embodiment, a pair of the emitter regions 61 is disposed in each of the cell regions 40 in the first inter-trench region 31 and the second inter-trench region 32. One of the pair of the emitter regions 61 is in contact with one of the two second trenches 20 defining the corresponding cell region 40, and the other of the pair of the emitter regions 61 is in contact with the other of the two second trenches 20 defining the corresponding cell region 40. Further, the emitter regions 61 are not disposed in the middle inter-trench region 33 between the first inter-trench region 31 and the second inter-trench region 32. Such a configuration makes it possible to reduce a number of electrons flowing from the emitter regions 61 to the drift region 63 as compared with a conventional configuration. That is, if the emitter regions 61 are disposed in all of the plurality of inter-trench regions 30, the number of emitter regions 61 is many. This causes an increase in the number of electrons flowing from the emitter regions 61 to the drift region 63. On the other hand, in the configuration described above, the emitter regions 61 are not disposed in the middle inter-trench region 33 between the first inter-trench region 31 and the second inter-trench region 32. This makes it possible to suppress the number of electrons flowing from the emitter regions 61 into the semiconductor substrate 2. Further, in the configuration described above, the pair of the emitter regions 61 is in contact with the two second trenches 20 defining the corresponding cell region 40, but is not in contact with the two first trenches 10. Such a configuration makes it possible to further reduce the number of electrons flowing from the emitter regions 61 to the drift region 63 as compared with the conventional configuration. That is, if the emitter regions 61 are disposed in contact with all of the two first trenches 10 and the two second trenches 20, a density of the emitter regions 61 within the cell region 40 is high. This causes an increase in the number of electrons flowing from the emitter regions 61 to the semiconductor substrate 2. On the other hand, in the configuration described above, the emitter regions 61 are not disposed at positions that are in contact with the two first trenches 10. This makes it possible to suppress the number of electrons flowing from the emitter regions 61 into the semiconductor substrate 2. Further, in the configuration described above, the pair of the emitter regions 61 is disposed, in an well-balanced manner, to make contact with the two corresponding second trenches 20. This allows electrons to flow from the emitter regions 61 into the semiconductor substrate 2 in an well-balanced manner in the cell regions 40. This as a result evens out the number of electrons flowing in, thus making it possible to suppress concentration of currents. For the reasons stated above, the configuration described above makes it possible to improve a breakdown resistance of a semiconductor device not only by suppressing the total number of electrons flowing in from emitter regions but also by preventing electrons from concentrating on a local region.

Further, according to the configuration described above, the emitter regions 61 are not in contact with the first trenches 10. This makes it easy for holes to accumulate in the drift region 63 located in the middle inter-trench region 33. That is, if the emitter regions 61 are in contact with the first trenches 10, it becomes easy for holes present around the first trenches 10 to flow in a direction away from the first trenches 10. This decreases a hole accumulation effect in the middle inter-trench region 33. On the other hand, since in the present embodiment, the emitter regions 61 are not in contact with the first trenches 10, holes become difficult to flow away from the first trenches 10, thus increasing the hole accumulation effect in the middle inter-trench region 33. This as a result makes it possible to reduce an on-resistance of the semiconductor device 1.

An embodiment has been described above, but specific aspects are not limited to the embodiment described above. In the following descriptions, components identical to those described above are given the same reference signs and, as such, are not described below.

(Second Embodiment)

Figure 6:
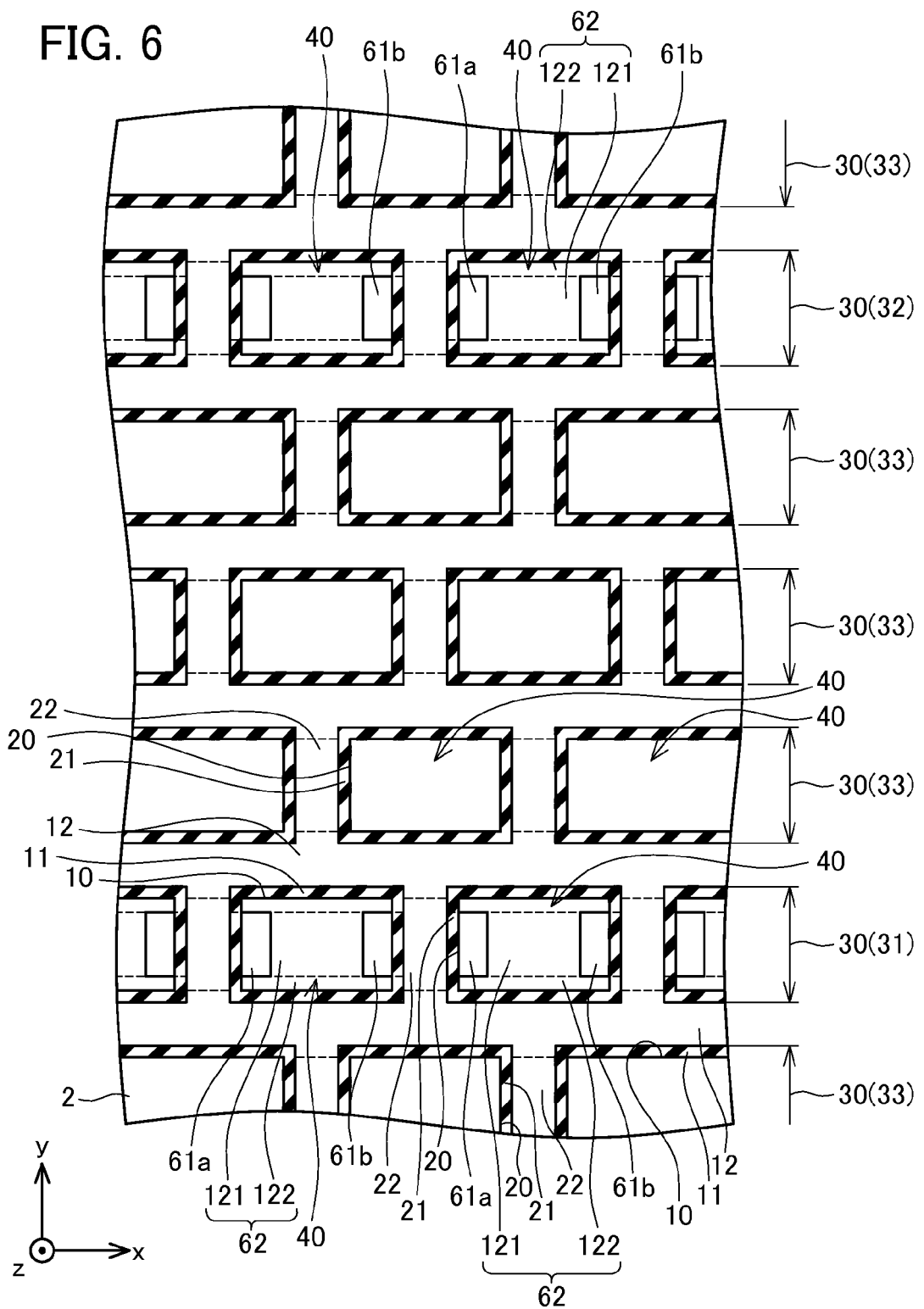
FIG. 6 is a plan view of a semiconductor device according to a second embodiment.

In the embodiment described above, a single middle inter-trench region 33 was disposed in between the first inter-trench region 31 and the second inter-trench region 32. However, the present disclosure may not be limited to this configuration. In a second embodiment, as shown in FIG. 6, a plurality of middle inter-trench regions 33 may be disposed between the first inter-trench region 31 and the second inter-trench region 32. At least one middle inter-trench region 33 should be disposed between the first inter-trench region 31 and the second inter-trench region 32. Such a configuration also makes it possible to, while suppressing local concentration of currents, suppress the number of electrons that are implanted.

(Third Embodiment)

Figure 7:
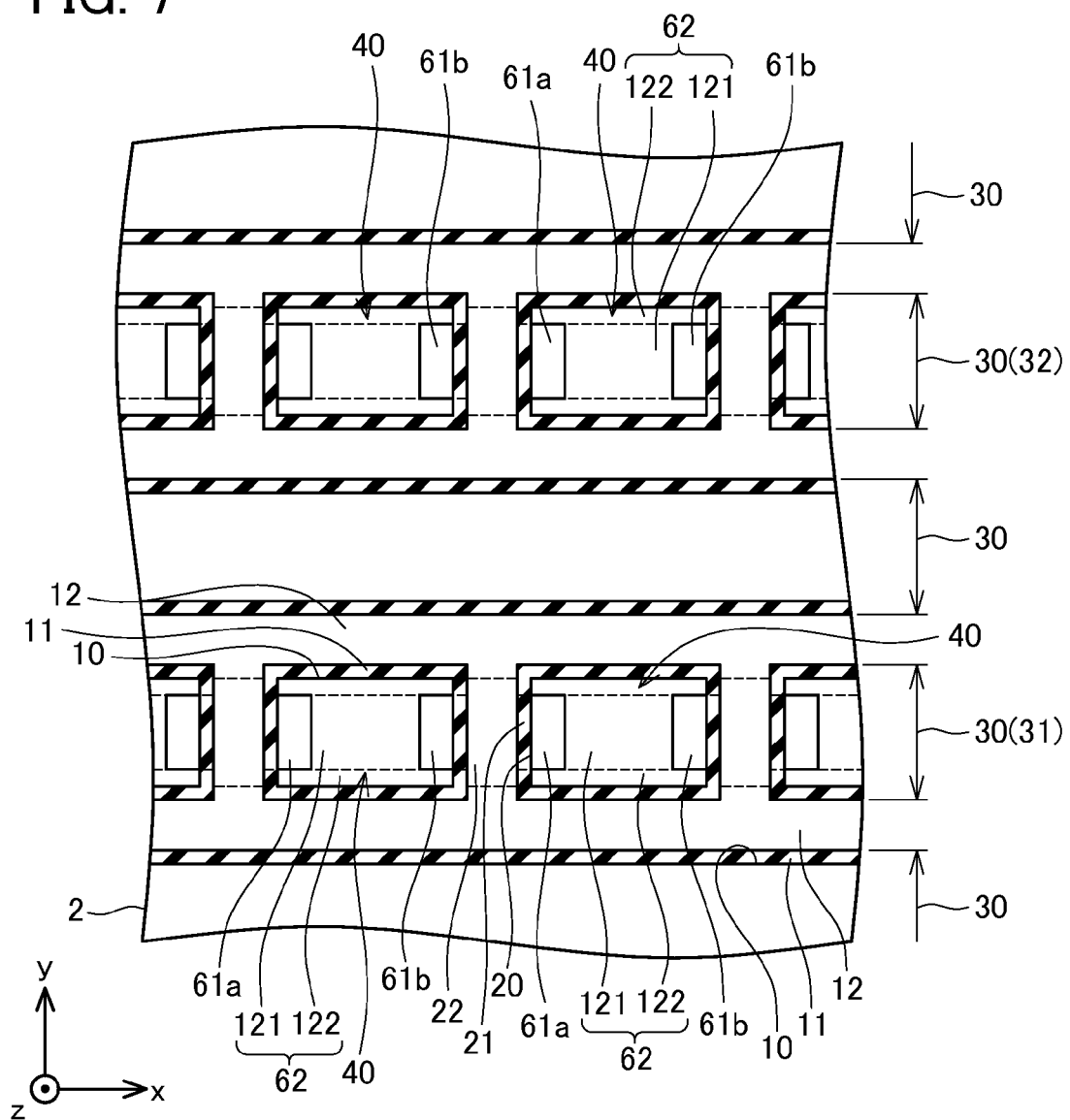
FIG. 7 is a plan view of a semiconductor device according to a third embodiment.

In the embodiment described above, the second trenches 20 are disposed in the middle inter-trench region 33 interposed between the first inter-trench region 31 and the second inter-trench region 32. However, the present disclosure may not be limited to this configuration. In a third embodiment, as shown in FIG. 7, the second trenches 20 may not be disposed in a middle inter-trench region 33 interposed between the first inter-trench region 31 and the second inter-trench region 32. Such a configuration also makes it possible to, while suppressing local concentration of currents, suppress the number of electrons that are implanted.

(Fourth Embodiment)

Figure 8:
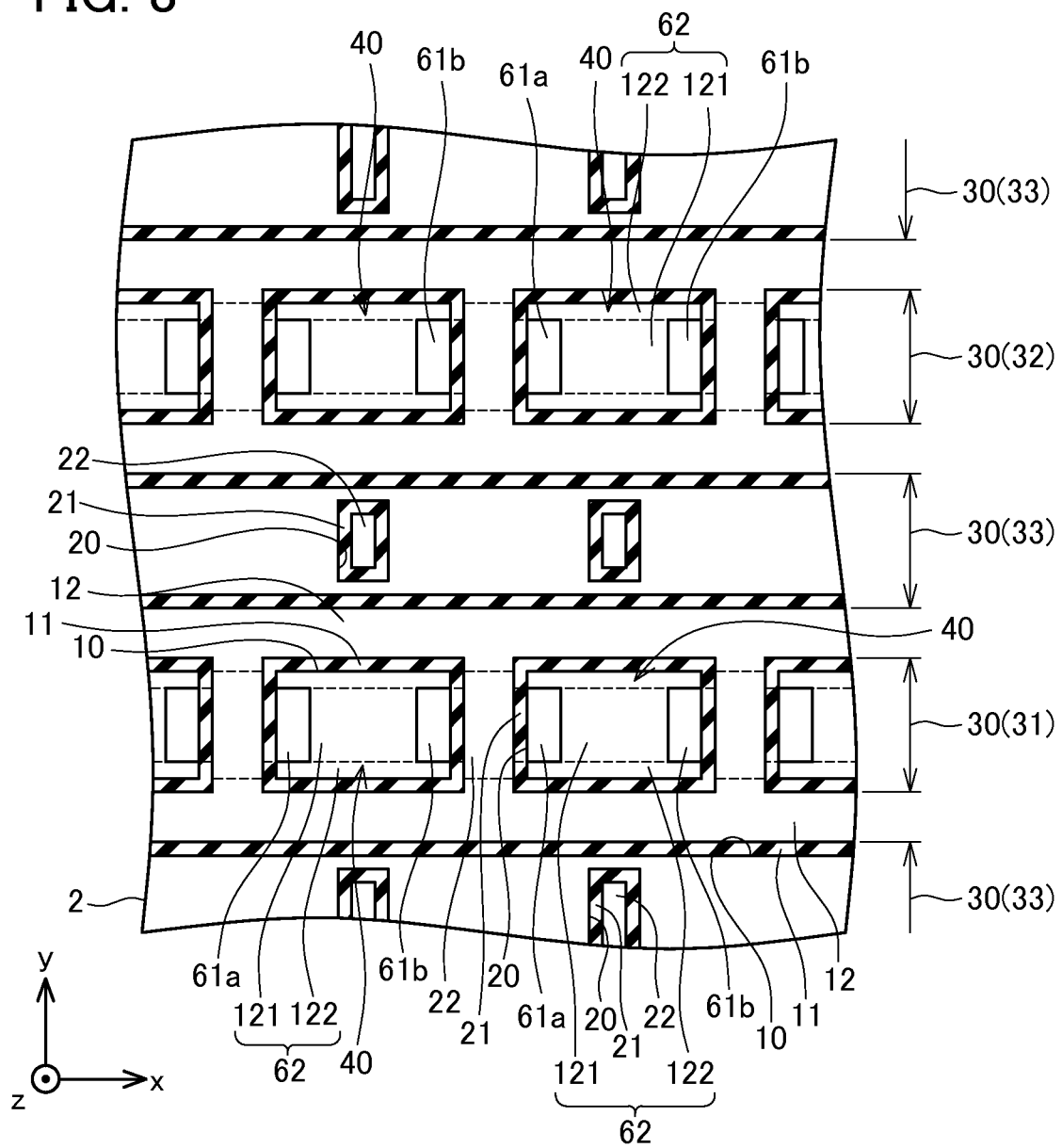
FIG. 8 is a plan view of a semiconductor device according to a fourth embodiment.

In the embodiment described above, both ends of each of the second trenches 20 disposed in the middle inter-trench region 33 interposed between the first inter-trench region 31 and the second inter-trench region 32 are in contact with first trenches 10 adjacent each other in the second direction, respectively. However, the present disclosure may not be limited to this configuration. In a fourth embodiment, as shown in FIG. 8, both ends of each of second trenches 20 disposed in the middle inter-trench region 33 interposed between the first inter-trench region 31 and the second inter-trench region 32 may not be in contact with the first trenches 10 adjacent each other in the second direction, respectively. In the middle inter-trench region 33 interposed between the first inter-trench region 31 and the second inter-trench region 32, each of the second trenches 20 is spaced away from the first trenches 10. Such a configuration also makes it possible to, while suppressing local concentration of currents, suppress the number of electrons that are implanted.

(Fifth Embodiment)

Figure 9:
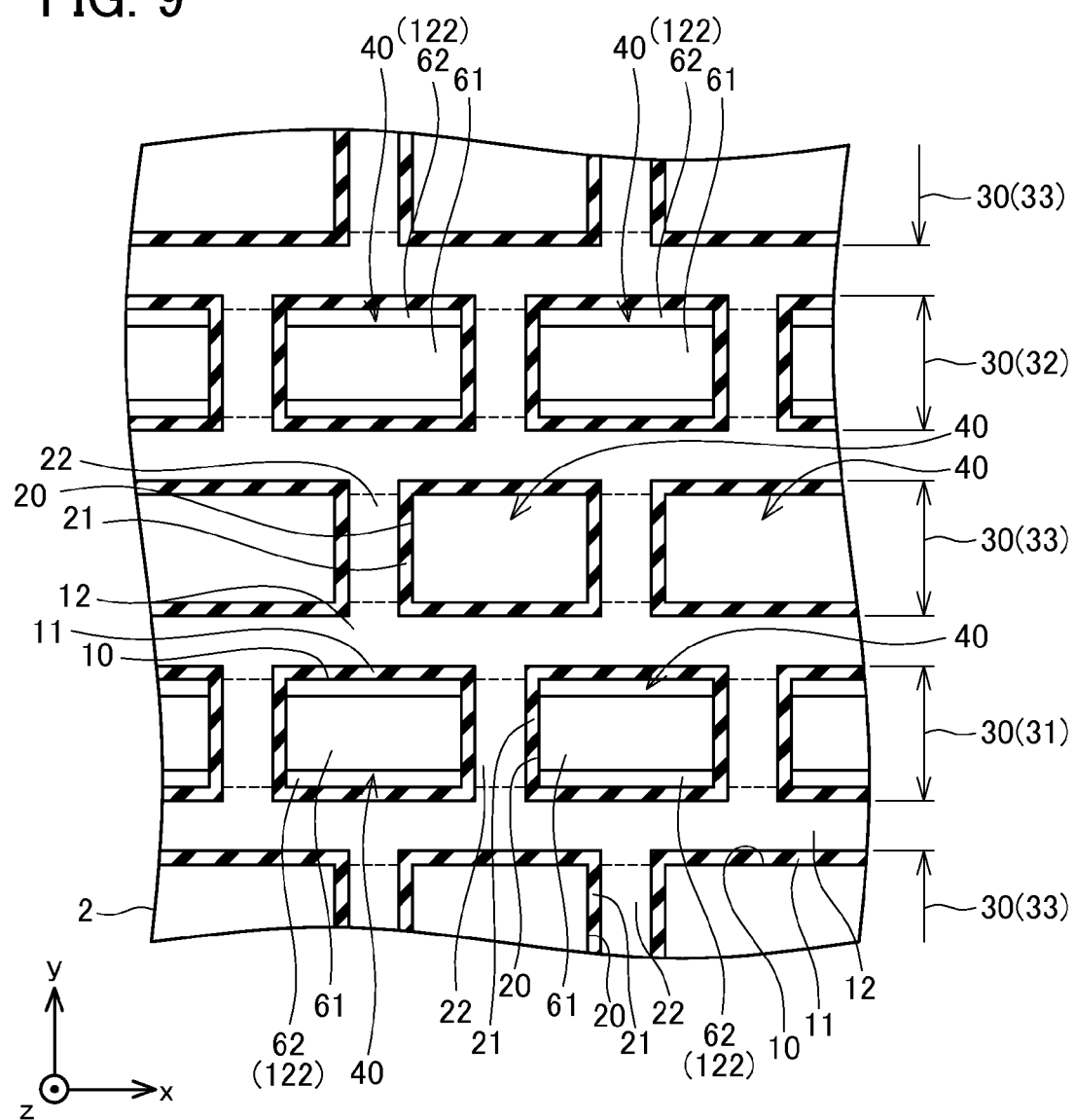
FIG. 9 is a plan view of a semiconductor device according to a fifth embodiment.

In the embodiment described above, the emitter regions 61 are formed in a pair in each of the cell regions 40, each of which is surrounded by first trenches 10 and second trenches 20. However, the present disclosure may not be limited to this configuration. In a fifth embodiment, as shown in FIG. 9, one emitter region 61 is disposed in each of the cell regions 40. The one emitter region 61 extends along the first direction. One end of the one emitter region 61 is in contact with one of second trenches 20 adjacent each other along the first direction, and the other end of the one emitter region 61 is in contact with the other of the second trenches 20 adjacent each other along the first direction.

Such a configuration also makes it possible to, while suppressing local concentration of currents, suppress the number of electrons that are implanted.

While specific examples have been described above in detail, these examples are merely illustrative and place no limitation on the scope of the patent claims. The technology described in the patent claims also encompasses various changes and modifications to the specific examples described above. The technical elements explained in the present description or drawings provide technical utility either independently or through various combinations. The present disclosure is not limited to the combinations described at the time the claims are filed. Further, the purpose of the examples illustrated by the present description or drawings is to satisfy multiple objectives simultaneously, and satisfying any one of those objectives gives technical utility to the present disclosure.

Some of other features of the present disclosure will be listed below. It should be noted that each of the features listed below is independently useful.

In the above semiconductor device, the emitter regions may be formed in a pair in each of the cell regions. One of the pair of the emitter regions may be in contact with one of the two second trenches defining the corresponding cell region, and the other of the pair of the emitter regions may be in contact with the other of the two second trenches defining the corresponding cell region.

The plurality of inter-trench regions may include a plurality of the middle inter-trench regions. At least one of the second trenches may be disposed in at least one of the middle inter-trench regions.

The emitter regions may be in contact with both sides of each of the second trenches in the first direction in the first inter-trench region and the second inter-trench region.

What is claimed is:

1. A semiconductor device including a semiconductor substrate in which a semiconductor element is disposed, the semiconductor device comprising:
   a p-type body region disposed at one portion of the semiconductor substrate in a cross sectional view of the semiconductor substrate;
   an n-type drift region disposed below the p-type body region in the cross sectional view;
   a plurality of n-type emitter regions separated from the n-type drift region by the p-type body region and exposed on an upper surface of the semiconductor substrate;
   a trench extending from the upper surface of the semiconductor substrate, piercing the p-type body region and reaching the n-type drift region in the cross sectional view, wherein the trench comprises, in a plan view of the semiconductor substrate, a plurality of first trenches extending in a first direction and arranged at intervals in a second direction intersecting the first direction, and a plurality of second trenches extending in the second direction and arranged at intervals in the first direction;
   a gate insulation film disposed on an inner surface of the trench;
   a gate electrode disposed in the trench;
   a plurality of inter-trench regions, each of the plurality of inter-trench regions being a region between two adjacent first trenches; and
   a plurality of cell regions, each of the plurality of cell regions being a region defined by two adjacent first trenches and two adjacent second trenches,
   wherein the plurality of inter-trench regions comprises:
      a first inter-trench region;
      a second inter-trench region separated from the first inter-trench region by at least one of the inter-trench regions being interposed in between in the second direction; and
      a middle inter-trench region interposed in between the first inter-trench region and the second inter-trench region,
      the emitter regions are disposed in at least one cell region in the first inter-trench region, are not disposed in the middle inter-trench region, and are disposed in at least one cell region in the second inter-trench region, and
   each of the emitter regions is disposed at a position that is not in contact with the first trenches but is in contact with the two second trenches defining the corresponding cell region.

2. The semiconductor device according to claim 1, wherein
   the emitter regions are formed in a pair in each of the cell regions,
   one emitter region of each pair of the emitter regions is in contact with one of the two second trenches defining the corresponding cell region, and the other emitter region of each pair of the emitter regions is in contact with the other of the two second trenches defining the corresponding cell region.

3. The semiconductor device according to claim 1, wherein
   the plurality of inter-trench regions comprises a plurality of the middle inter-trench regions, and
   at least one of the second trenches is disposed in at least one of the middle inter-trench regions.

4. The semiconductor device according to claim 1, wherein
   the emitter regions are in contact with both sides of each of the second trenches in the first direction in the first inter-trench region and the second inter-trench region.

* * * * *